United States Patent
Magerlein et al.

(10) Patent No.: US 6,661,098 B2
(45) Date of Patent: Dec. 9, 2003

(54) HIGH DENSITY AREA ARRAY SOLDER MICROJOINING INTERCONNECT STRUCTURE AND FABRICATION METHOD

(75) Inventors: John Harold Magerlein, Yorktown Heights, NY (US); Kevin Shawn Petrarca, Newburgh, NY (US); Sampath Purushothaman, Yorktown Heights, NY (US); Carlos Juan Sambucetti, Croton-on-Hudson, NY (US); Richard Paul Volant, New Fairfield, CT (US); George Frederick Walker, New York, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/052,620

(22) Filed: Jan. 18, 2002

(65) Prior Publication Data

US 2003/0137058 A1 Jul. 24, 2003

(51) Int. Cl.$^7$ .......................... H01L 23/48; H01L 23/52; H01L 29/40
(52) U.S. Cl. ...................... 257/777; 257/678; 257/779
(58) Field of Search ................................ 257/678, 737, 257/738, 768, 769, 770, 771, 777, 778, 779, 784

(56) References Cited

U.S. PATENT DOCUMENTS

| | | | |
|---|---|---|---|
| 5,808,360 A | * | 9/1998 | Akram et al. ............... 257/738 |
| 6,137,185 A | * | 10/2000 | Ishino et al. ................. 257/786 |
| 6,339,024 B1 | | 1/2002 | Petrarca et al. .............. 438/686 |
| 6,344,125 B1 | | 2/2002 | Locke et al. ................. 205/118 |
| 6,368,484 B1 | * | 4/2002 | Volant et al. ................ 205/220 |
| 6,373,273 B2 | * | 4/2002 | Akram et al. ................ 324/765 |

OTHER PUBLICATIONS

Richard Volant, Kevin Petrarca, Peter Locke, James A. Tornello and Donald F. Canaperi, Tittle: "Replated Metal Structures for Semiconductor Devices", U.S. patent application Ser. No. 09/657,469, filed on May 9, 2000.

* cited by examiner

*Primary Examiner*—David Nhu
(74) *Attorney, Agent, or Firm*—Ohlandt, Greeley, Ruggiero & Perle, L.L.P.; Daniel P. Morris

(57) ABSTRACT

A system for interconnecting a set of device chips by means of an array of microjoints disposed on an interconnect carrier is taught. The carrier is provided with a dense array of microjoint receptacles with an adhesion layer, barrier layer and a noble metal layer; the device wafers are fabricated with an array of microjoining pads comprising an adhesion layer, barrier layer and a fusible solder layer with pads being located at matching locations in reference to the barrier receptacles; said device chips are joined to said carrier through the microjoint arrays resulting in interconnections capable of very high input/output density and inter-chip wiring density.

16 Claims, 3 Drawing Sheets

HIGH DENSITY AREA ARRAY SOLDER MICROJOINING INTERCONNECT STRUCTURE AND FABRICATION METHOD

FIELD OF THE INVENTION

This invention pertains to the field of microelectronics, and more particularly to the field of fabricating and interconnecting extremely small semiconductor devices, commonly referred to as "chips."

RELATED INVENTIONS

The present invention is related to certain inventions assigned to the assignee of the present invention. These are disclosed in co-pending applications YOR920010249US1 and YOR920010217US1.

BACKGROUND OF THE INVENTION

Increased levels of integration in the silicon transistor technology over the last two decades have facilitated the migration from large scale integrated (LSI) to very large scale integrated (VLSI) and now to ultra-large scale integrated (ULSI) circuits for use in silicon chips for computing, communication and micro controller applications. Optimum utilization of these highly integrated silicon chips requires a more space efficient packaging with supporting devices such as memory chips. Further, with the advent of mobile communication devices, hand held organizers and computing devices, there has also been a push to integrate such varied functions into a single compact system. This in turn has led to the push in the microelectronics industry towards system-on-a-chip (SOC) approach.

Simply stated, the SOC approach attempts to integrate as many of these different device functionalities on the same silicon chip so that a single large chip can provide a variety of functions to the end user. Although conceptually very attractive, such an approach is practically daunting due to several reasons. First, the materials, fabrication processes and feature sizes optimum for the different microelectronic devices (such as memory chips, logic chips, wireless communication chips, etc.) are quite different from each other. Combining them all onto the same chip implies making compromises that can limit the performance achievable in each of the device blocks in the SOC. Second, integration of a large number of functional blocks requires a large chip size with many levels of wiring constructed on the chip. Both these factors tend to reduce the yield and increase the cost per chip, which is undesirable. Third, one has to design and build every unique combination of functions (e.g., memory and microprocessor, wireless communication and microprocessor, etc.) leading to a large variety of chip part numbers and product mix that is not conducive to low cost manufacturing. Last, the expertise required for combining a diverse set of materials, process and integration schemes on a single SOC is often not available in a single enterprise as these are currently part of different microelectronic businesses.

An attractive alternative to SOC is system-on-a-package or SOP wherein a number of chips, each optimized for its unique function and perhaps manufactured in different factories specially tailored to produce the specific chips, are combined on a first level packaging carrier that interconnects them and allows the resulting package to function as a single system. The level of interconnection and input-output-(I/O) density required in such a package is expected to be far greater than those currently available in printed circuit board or multilayer ceramic technologies. Since this SOP carrier with chips assembled on it is expected to replace an SOC, it is reasonable to expect that the interconnect and I/O densities should be somewhere between those used in the far back end of the line (FBEOL) interconnect levels on chips (typically wiring and vias on 500 nm to 1000 nm pitch) and the most aggressive packaging substrates (typically vias and wiring on 10,000 to 20,000 nm pitch). Extension of the FBEOL processes at the required wiring size and pitch for the SOP carrier is feasible if the carrier itself is made of silicon. In addition, however, the carrier would be required to support a high I/O density in order to interconnect the various device chips mounted on it. Greater the granularity of the system, that is, finer the division of the system into sub-units or chips, greater will be the number of I/Os required. It is expected that such I/O densities will necessitate bonding pads that are on the order of 5 to 10 $\mu$m size and spaces which are presently outside the realm of possibility of typical packaging I/O pads which are at least 10 to 20 times coarser in size and spacing.

It is therefore highly desirable to enable a microjoining structure to interconnect several chips on to a system-on-a-package carrier to achieve significantly higher input/output density between the chips as compared to the current state-of-the-art.

Accordingly, a primary object of the present invention is to make possible ultra high density of interconnections facilitating the use in ultra large scale integrated circuit chips (logic, microprocessor, memory, network switching). Current flip chip solder technology can achieve only about 75 $\mu$m pads on 150 $\mu$m centers. Our method is capable of aerial densities up to 1000 times or more this level. This is made possible by the unique process flow that does not require any special lithographic steps in the fabrication of the contact pads and uses the fine features in these device chips at the back end of the line (BEOL) interconnection level.

SUMMARY OF THE INVENTION

A structure is proposed, comprising a fine pitch (down to about 2.5 $\mu$m pads on 5 $\mu$m centers) array of interconnects between a device component (semiconductor chip, optical device such as a laser, discrete or integrated passive components, and the like) also referred to as a chiplet; and a carrier that houses one or many of these components. The carrier can be a silicon, ceramic or organic substrate but most preferably made of silicon to achieve the highest interconnection density. The joining metallurgy on the device side comprises an adhesion layer, solder reaction barrier layer and a fusible solder joint ball. On the carrier side the matching contact pads are intentionally made larger than the ones on the device side and comprise an adhesion layer, solder reaction barrier layer and a noble metal protection/solder wetting layer. Alternately, the said larger contact pads can be part of the top level of the device and the fusible solder bearing structure integrated on the carrier if so desired.

The foregoing and still further objects and advantages of the present invention will be more apparent from the following detailed explanation of the preferred embodiments of the invention in connection with the accompanying drawing.

DESCRIPTION OF PREFERRED EMBODIMENT

Figure 1:
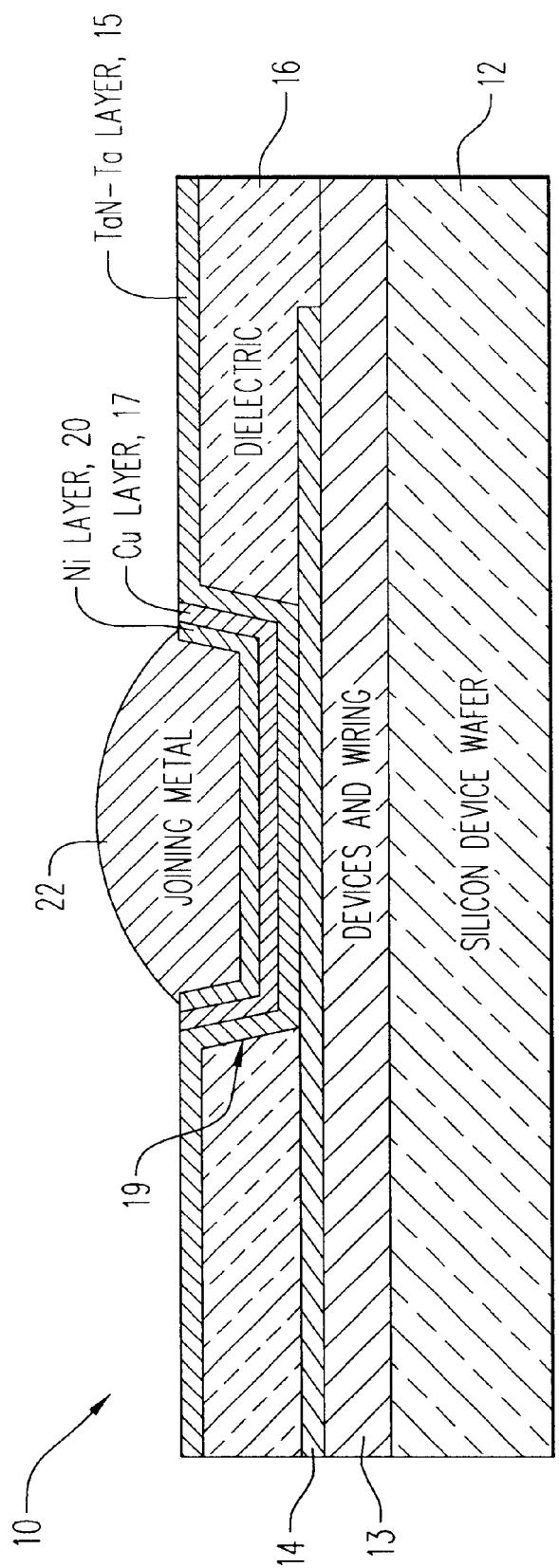
FIG. 1 is a sectional view of a device chiplet after the deposition of TaN—Ta, Cu, Ni, and joining metal.
Figure 3:
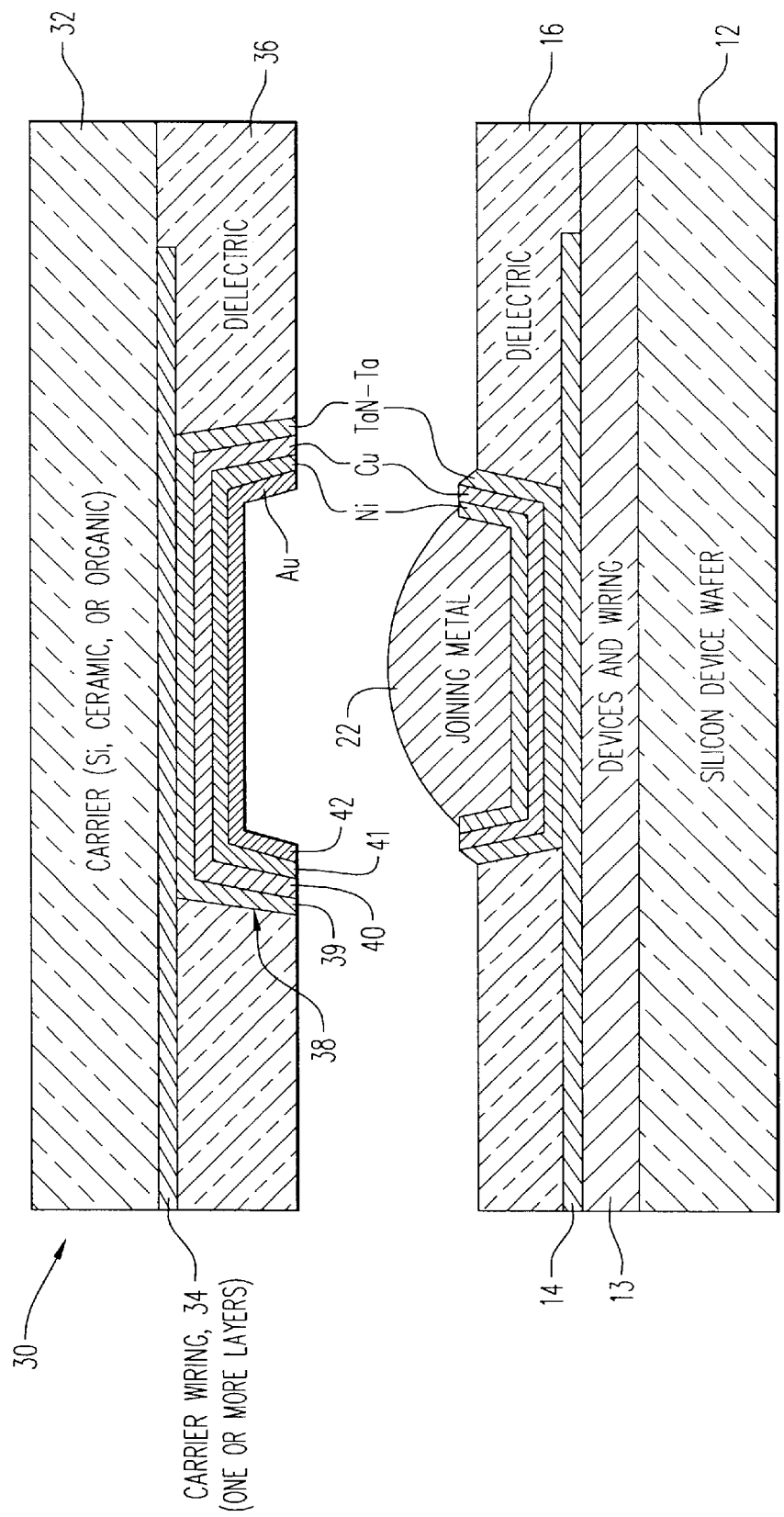
FIG. 3 is a sectional view of the completed carrier (top) ready for joining to the completed device chiplet (bottom).

Referring now to the Figures of the Drawing, the details of the preferred method for fabricating and assembling the interconnections are now described, first, with respect to a device chiplet 10:

Chiplet Process:

"Referring now to the FIGS. of the drawing, the chiplet process begins with fabricating the silicon device chiplet wafer 12 through the semiconductor device and bottom wiring layers 13 and the top metal wiring level 14, application of the final passivation dielectric stack 16, and the opening of the terminal pad vias (TV) 19. The TV via openings 19 can be as small as 2.5 microns in width and the passivation layer is about 1 micron or less in thickness. Then the following steps are carried out: Deposit by sputtering or other vacuum deposition methods a liner layer 15, which typically comprises about 400 Å tantalum nitride (TaN) and 400 Å Tantalum(Ta) and a seed layer 17, comprising about 1000 Å or more of vacuum deposited copper. Other liner materials that can be used include Ti, TiN, W, WN and Cr among others. The wafer is then subjected to chemical-mechanical polishing (OMP) so as to polish the copper from the top surface of the wafer stopping on the Ta surface. This results in a structure as shown in FIG. 1 wherein the copper seed 17 is preserved only at the bottom and the side walls of the TV openings 19. Electroplate a barrier layer 20, which can be Ni, Co, Pt, Pd and the like of about 5000 Å thickness followed by a joining metal layer 22, which is a fusible solder such as 97% Pb 3% Sn alloy, Au—Sn alloys or other solders depending upon the application and solder hierarchy desired. Pb free solders based on Sn and its alloys are also possible for layer 22. The solder layer thickness can be chosen to be between 2 microns to 100 microns depending on the solder alloy and the application need. The key feature to note is that layers 20 and 22 plate up only on the Cu present in the TV openings 19 and not on the liner layer 15 present on the top of the wafer. The liner layer 15 serves simply as an electrode to carry the plating current in the process. Layer 15 is subsequently removed by dry plasma or wet chemical etching from the chiplet top surface regions between the contact pads leaving behind a residual TaN Ta layer 15', only in the TV via bottom and side walls of the chiplet pad structure as shown in FIG. 3 (bottom).

Preferably, the liner layer thickness in the system according to the present invention is between 50 Å and 1200 Å. Also preferably, the seed layer in the system according to the present invention is copper with thickness in the range 300 Å to 2000 Å. More preferably, the seed layer in the system according to the present invention is copper with thickness in the range 300 Å to 2000 Å, and the microjoint pads on the device chips include successive layers of a liner layer, seed layer, barrier layer and a fusible solder layer, respectively.

Carrier Process (for a Silicon Carrier):

This process provides the mating connection to the solder microjoints fabricated on the chiplets. The carrier wafers 30 are fabricated through the final interconnect wiring 34, deposition of final passivation stack 36 and the opening of TV vias 38. The TV vias on the carrier will be larger in dimension than the nominal dimension of the microjoint solder pads on the chiplet to ensure that the microjoints can be comfortably located into the carrier via receptacles.

Figure 2:
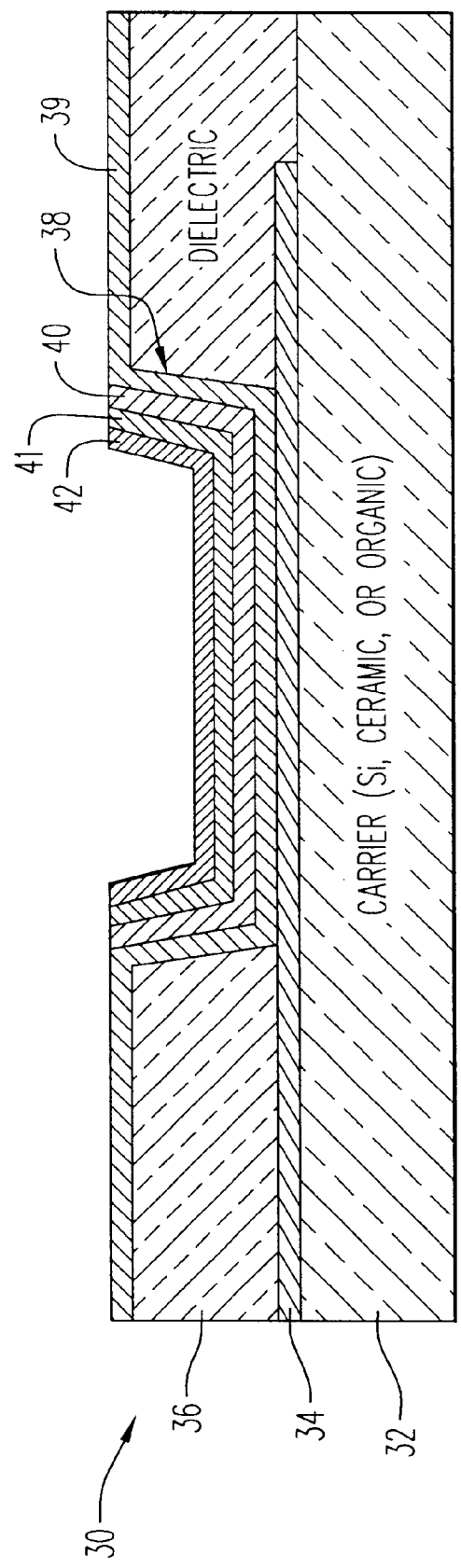
FIG. 2 is a sectional view of the carrier wafer after the deposition of TaN—Ta, Cu, Ni, and noble metal.

The subsequent process flow for the carrier wafers has the following steps: Deposit by sputtering or other vacuum deposition methods a liner layer 39, which typically comprises about 400 Å tantalum nitride (TaN) and 400 Å Tantalum (Ta) and a seed layer 40, comprising about 1000 Å of vacuum deposited copper. The wafer is then subjected to chemical-mechanical polishing (CMP) so as to polish the copper from the top surface of the wafer stopping on the Ta surface. This results in a structure on the carrier as shown in FIG. 2 wherein the copper seed 40, is preserved only at the bottom and the side walls of the TV openings 38. Electroplate a barrier layer 41, which can be Ni, Co, Pt, Pd and the like of about 5000 Å thickness followed by a noble metal layer 42, which is preferably gold in the thickness range of 1000 Å to 10,000 Å. The key feature to note is that layers 41 and 42 plate up only on the Cu present in the TV openings 38, and not on the liner layer present on the top surface of the carrier wafer. The liner layer 39, serves simply as an electrode to carry the plating current in the process. Layer 39 is subsequently removed by dry plasma or wet chemical etching from the top surface regions between the pads leaving behind a residual TaN Ta layer 39, only in the TV via bottom and side walls of the carrier pad structure as shown in FIG. 3 (top). Other methods for applying the barrier layer 41 and noble metal layer 42 include electroless deposition. Electroless deposition of Ni, Co, Pd as well as noble metal Au is known in the art and can be used instead of electroplating. Electroless Au plating and immersion Au are particularly suitable if thin Au (about 800 Å to 12,000 Å) is deemed sufficient. The resulting feature on the carrier is receptacle 44 for receiving microjoints fabricated on the chiplet.

Assembly Process (and the Resulting Final Structure):

The assembly involves pick and place of the chiplets in a manner similar to the regular flip chip assembly (split optics and/or capacitance aligned) and subjected to reflow joining. A hydrogen reflow without flux may be preferred since the gap between the chiplet and the carrier may be too small for efficient flux cleaning.

It will now have become apparent that further key advantages of the disclosed invention over the prior art are as follows: The microjoining scheme allows area array mounting of very small devices such as lasers, microsensors, or actuators. These devices can be as small as 100 $\mu$m×100 $\mu$m or less and are too small to be mounted with standard flip chip contacts. The use of PbSn solders allows reworkable connections for device chip replacement for upgrade or repair. The devices with these microjoining solder pads can be tested, burned in and sorted for known good devices using the temporary device attach structure described in our related application YOR920010249US1. Thus, obtaining known good die is not an issue despite the fine pitch of the interconnects.

The invention having been thus described with particular reference to the preferred forms thereof, it will be obvious that various changes and modifications may be made therein without departing from the spirit and scope of the invention as defined in the appended claims.

What is claimed is:

1. A system for connecting a set of device chips by means of an array of microjoint structures on an interconnect carrier comprising:

a carrier including a multilayer substrate having a plurality of microjoint receptacles in one surface;

a set of microjoint pads, including solder balls, on the device chips joined to the receptacles in the one carrier surface; and an interconnect wiring mounted in the carrier connecting to the microjoint pad arrays to enable the interconnection between device chips mounted on the carrier.

2. A system as defined in claim 1, wherein said receptacles on said interconnect carrier comprise successive layers of a liner layer, seed layer, barrier layer and a noble metal layer, respectively, these layers lining the inner surface of said receptacles.

3. A system as defined in claim 2, wherein the liner layer is selected from the group consisting of Ta, TaN, Ti, TiN, W, WN, Cr and combination thereof.

4. A system as defined in claim 3, wherein the liner layer thickness is between 50 Å and 1200 Å.

5. A system as defined in claim 2, wherein the seed layer is copper with thickness in the range 300 Å to 2000 Å.

6. A system as defined in claim 2, wherein the barrier layer is selected from the group consisting of Ni, Co, Pt, Pd and alloys or combinations thereof.

7. A system as defined in claim 6 wherein the barrier layer thickness is between 1000 Å and 10,000 Å.

8. A system as defined in claim 1 wherein said microjoint pads on said device chips comprise successive layers of a liner layer, seed layer, barrier layer and a fusible solder layer, respectively.

9. A system as defined in claim 8 wherein the liner layer is selected from the group comprising Ta, TaN, Ti, TiN, W, WN, Cr and combinations thereof.

10. A system as defined in claim 8 wherein the seed layer is copper with thickness in the range 300 Å to 2000 Å.

11. A system as defined in claim 8 wherein the barrier layer is selected from the group comprising Ni, Co, Pt, Pd and alloys or combinations thereof.

12. A system in accordance with claim 11 wherein the barrier layer thickness is between 1000 Å and 10,000 Å.

13. A system as defined in claim 2 wherein the carrier is made of silicon and includes a set of interconnect wiring disposed thereon, a dielectric passivation layer over the top surface of the interconnect wiring and said receptacles being in the dielectric passivation layer.

14. A system as defined in claim 12 wherein the device chiplet includes a set of devices built on it connected by wiring, a dielectric passivation layer over the top surface of the wiring and said microjoint pads being in the dielectric passivation layer.

15. A system as defined in claim 12 wherein the device chiplets are selected from the group comprising microprocessor chip, memory chip, microcontroller chip, laser diode chip, laser driver chip, photodetector chip, wireless communication chip, and logic processor chip.

16. A system for connecting a set of device chips by means of an array of microjoint structures on an interconnect carrier comprising:

a carrier including a multilayer substrate having a plurality of microjoint receptacles in one surface;

a set of microjoint pads, including solder balls, on the device chips joined to the receptacles in the one carrier surface; and an interconnect wiring mounted in the carrier connecting to the microjoint pad arrays to enable the interconnection between device chips mounted on the carrier;

wherein said receptacles on said interconnect carrier comprise successive layers of a liner layer, seed layer, barrier layer and a noble metal layer, respectively, these layers lining the inner surface of said receptacles.

* * * * *